(12) United States Patent  
Shin

(10) Patent No.: US 11,764,216 B2  
(45) Date of Patent: Sep. 19, 2023

(54) SEMICONDUCTOR DEVICE WITH CONTROLLABLE CHANNEL LENGTH AND MANUFACTURING METHOD THEREOF

(71) Applicant: KEY FOUNDRY CO., LTD., Cheongju-si (KR)

(72) Inventor: Hyun Kwang Shin, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

(21) Appl. No.: 17/689,364

(22) Filed: Mar. 8, 2022

(65) Prior Publication Data

US 2022/0189955 A1    Jun. 16, 2022

Related U.S. Application Data

(63) Continuation of application No. 16/682,439, filed on Nov. 13, 2019, now Pat. No. 11,322,492.

(30) Foreign Application Priority Data

Jul. 24, 2019    (KR) .......................... 10-2019-0089840

(51) Int. Cl.
*H01L 27/088* (2006.01)
*H01L 21/762* (2006.01)
(Continued)

(52) U.S. Cl.
CPC .......... *H01L 27/088* (2013.01); *H01L 21/762* (2013.01); *H01L 21/823412* (2013.01);
(Continued)

(58) Field of Classification Search
CPC .......... H01L 29/66674; H01L 29/7801; H01L 29/7816; H01L 29/4238; H01L 29/45;
(Continued)

(56) References Cited

U.S. PATENT DOCUMENTS 7,652,307 B2    1/2010    Kikuchi et al.
8,575,702 B2    11/2013   Cha et al.
(Continued)

FOREIGN PATENT DOCUMENTS

JP    2007-080919 A    3/2007
JP    2014-175640 A    9/2014
(Continued)

OTHER PUBLICATIONS

Korean Office Action dated Mar. 30, 2021 in corresponding Korean Patent Application No. 10-2021-0036494. (5 pages in Korean).
(Continued)

*Primary Examiner* — Natalia A Gondarenko
(74) *Attorney, Agent, or Firm* — NSIP Law

(57) ABSTRACT

A semiconductor device includes a ring-shaped gate electrode having an opening area disposed on a substrate, a source region and a bulk tap region disposed in the opening area, a well region disposed to overlap the ring-shaped gate electrode, a drift region disposed to be in contact with the well region, a first insulating isolation region disposed, on the drift region, to partially overlap the gate electrode, a second insulating isolation region enclosing the bulk tap region, a drain region disposed to be spaced apart from the ring-shaped gate electrode, and a deep trench isolation region disposed adjacent to the drain region.

18 Claims, 13 Drawing Sheets

(51) Int. Cl.
*H01L 21/8234* (2006.01)
*H01L 29/78* (2006.01)
*H01L 29/66* (2006.01)

(52) U.S. Cl.
CPC ............ *H01L 21/823481* (2013.01); *H01L 21/823493* (2013.01); *H01L 29/66674* (2013.01); *H01L 29/7801* (2013.01)

(58) Field of Classification Search
CPC ......... H01L 29/66659; H01L 29/66681; H01L 29/0634; H01L 29/0638; H01L 29/0649; H01L 29/0653; H01L 29/0696; H01L 29/1095; H01L 29/1083; H01L 29/7835; H01L 29/0852; H01L 29/0882; H01L 29/7846; H01L 29/7848; H01L 27/088; H01L 21/28518; H01L 21/26513; H01L 21/31055; H01L 21/02129; H01L 21/762; H01L 21/76205–7621; H01L 21/76224–76237; H01L 21/76283–76286; H01L 21/764; H01L 21/823412; H01L 21/823481; H01L 21/823493; H01L 21/823418; H01L 21/8236
USPC ........ 257/420, 337, 324, 343, 368, E29.256, 257/E29.268; 438/286, 422
See application file for complete search history.

(56) References Cited

U.S. PATENT DOCUMENTS

| 8,809,991 | B2 | 8/2014 | Park |
| 8,853,787 | B2 | 10/2014 | Cha et al. |
| 8,969,161 | B2 | 3/2015 | Cha et al. |
| 9,590,097 | B2 | 3/2017 | Yang et al. |
| 9,627,518 | B2 | 4/2017 | Park et al. |
| 9,698,258 | B2 | 7/2017 | Ryu et al. |
| 9,905,687 | B1 * | 2/2018 | Zhu .................... H01L 29/7801 |
| 10,418,482 | B2 | 9/2019 | Huang |
| 10,535,730 | B2 | 1/2020 | Murukesan et al. |
| 2003/0038316 | A1 | 2/2003 | Tsuchiko et al. |
| 2008/0188045 | A1 | 8/2008 | Morris |
| 2011/0079849 | A1 * | 4/2011 | Yan .................... H01L 29/4238 |
| | | | 257/E29.256 |
| 2011/0089492 | A1 | 4/2011 | Yilmaz |
| 2011/0127612 | A1 | 6/2011 | Cha et al. |
| 2011/0215402 | A1 * | 9/2011 | Lee .................... H01L 29/1095 |
| | | | 257/E29.256 |
| 2013/0344671 | A1 * | 12/2013 | Kim .................... H01L 29/0696 |
| | | | 438/286 |
| 2014/0027846 | A1 | 1/2014 | Cha et al. |
| 2014/0030862 | A1 | 1/2014 | Cha et al. |
| 2014/0291767 | A1 * | 10/2014 | Lee .................... H01L 29/7835 |
| | | | 438/422 |
| 2015/0069509 | A1 | 3/2015 | Lee et al. |
| 2015/0325639 | A1 | 11/2015 | Liao |
| 2017/0125584 | A1 | 5/2017 | Zhang et al. |
| 2018/0130900 | A1 * | 5/2018 | Usami .................... H01L 21/743 |
| 2019/0172946 | A1 * | 6/2019 | Wu .................... H01L 21/28518 |

FOREIGN PATENT DOCUMENTS

| KR | 10-2003-0033810 A | 5/2003 |
| KR | 10-0462365 B1 | 12/2004 |
| KR | 10-2011-0059345 A | 6/2011 |
| KR | 10-2013-0090286 A | 8/2013 |
| KR | 10-2015-0028602 A | 3/2015 |
| KR | 10-2016-0001913 A | 1/2016 |
| KR | 10-2016-0077541 A | 7/2016 |
| KR | 10-2019-0037084 A | 4/2019 |

OTHER PUBLICATIONS

Korean Office Action dated Aug. 23, 2020 in corresponding Korean Patent Application No. 10-2019-0089840 (9 pages in Korean).

* cited by examiner

SEMICONDUCTOR DEVICE WITH CONTROLLABLE CHANNEL LENGTH AND MANUFACTURING METHOD THEREOF

CROSS-REFERENCE TO RELATED APPLICATIONS

This application is a continuation of U.S. application Ser. No. 16/682,439, filed on Nov. 13, 2019, which claims the benefit under 35 U.S.C. 119(a) of Korean Patent Application No. 10-2019-0089840 filed on Jul. 24, 2019 in the Korean Intellectual Property Office, the entire disclosure of which is incorporated herein by reference for all purposes.

BACKGROUND

1. Field

The present disclosure relates to a semiconductor device, and more particularly, to a high voltage semiconductor device with controllable channel length and a manufacturing method thereof.

2. Description of Related Art

In general, integrated circuits in which one or more high voltage transistors are disposed on the same chip together with low voltage circuits are widely used in many electrical applications. In such integrated circuits, Extended Drain MOS (EDMOS) transistors, Laterally Double Diffused MOS (LDMOS) transistors, and the like are important high voltage semiconductor devices.

As the degree of integration of semiconductor devices increases, it is well known that in the design of high voltage semiconductor devices, continuous scale down is required and sufficient operating characteristics are to be secured.

The alternative art has a limitation in implementing high voltage with a rectangular typed nEDMOS. In addition, when junction isolation is used in a bulk wafer, the chip size increases due to the area occupied by the junction isolation region. Further, Junction isolation techniques have a limitation to implement a high breakdown voltage (BVDSS). In addition, a rectangular typed nEDMOS has a limitation in that a high breakdown voltage cannot be obtained because electric fields can be concentrated at each corner.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a ring-shaped gate electrode having an opening area disposed on a substrate, a source region and a bulk tap region disposed in the opening area, a well region disposed to overlap the ring-shaped gate electrode, a drift region disposed to be in contact with the well region, a first insulating isolation region disposed, on the drift region, to partially overlap the gate electrode, a second insulating isolation region enclosing the bulk tap region, a drain region disposed to be spaced apart from the ring-shaped gate electrode, and a deep trench isolation region disposed adjacent to the drain region.

The second insulating isolation region may be shaped to partially enclose the source region.

The semiconductor device may further include a deep well region disposed under the well region.

The semiconductor device may further include a buried oxide film disposed on the substrate, and a buried impurity layer disposed on the buried oxide film. The deep trench isolation region may be deeper than the first insulating isolation region and disposed to be in contact with an upper surface of the buried oxide film.

The deep well region, the well region, and the ring-shaped gate electrode may overlap each other.

In another general aspect, a semiconductor device includes a ring-shaped gate electrode having an opening area on a substrate, a source region disposed in the opening area, a well region disposed to overlap the ring-shaped gate electrode, and a drain region disposed to be spaced apart from the ring-shaped gate electrode. Each corner of the ring-shaped gate electrode has a first radius of curvature, each corner of the well region has a second radius of curvature, and the first radius of curvature is greater than the second radius of curvature.

The semiconductor device may further include a deep well region under the well region. Each corner of the deep well region may have a third radius of curvature, and the second radius of curvature may be greater than the third radius of curvature.

The semiconductor device may further include a first insulating isolation region disposed to overlap the ring-shaped gate electrode, and a deep trench isolation region enclosing the ring-shaped gate electrode. The depth of the deep trench isolation region may be deeper than the depth of the first insulating isolation region.

The deep well region, the well region, and the ring-shaped gate electrode may overlap with each other.

In another general aspect, a semiconductor device includes a buried oxide film on the substrate, a buried impurity layer disposed in the buried oxide film, a deep well region disposed to be in contact with the buried impurity layer, a well region disposed on the deep well region and having a same conductivity type as the deep well region, first and second drift regions disposed to be in contact with the well region, a gate electrode disposed to overlap each of the first and second drift regions, a source region and a bulk tap region disposed between the gate electrode and disposed in the well region, and a drain region disposed to be spaced apart from the gate electrode by a predetermined distance.

The gate electrode may have a ring shape having an opening area.

The semiconductor device may further include a first insulating isolation region disposed on the drift region and overlapping with the gate electrode, a second insulating isolation region completely surrounding the bulk tap region, and a deep trench isolation region disposed near the drain region.

The second isolation region may be shaped to partially enclose the source region.

The deep trench isolation region may be deeper than the insulating isolation region and may be disposed in contact with the buried oxide film.

The deep well region, the well region, and the gate electrode may overlap with each other.

The deep well region, the well region, and the gate electrode, each corner has a curved-shape corner in a top view.

A channel length of the semiconductor device may be controlled by laterally shifting a virtual line passing over the deep well region, the well region and the gate electrode in an overlapping relationship with each other.

A channel length of the semiconductor device may be controlled by laterally shifting a virtual line passing over the well region and the gate electrode in an overlapping relationship with each other.

In another general aspect, a semiconductor device includes a gate electrode having an opening area disposed on a substrate, an insulating isolation region, a well region, a drift region, a drain region, and a deep trench isolation region. The insulating isolation region, disposed in the opening area, has a contour delineating source regions and a bulk tap region. The well region is disposed to overlap the gate electrode. The drift region is disposed to be in contact with the well region. The drain region is disposed to be spaced apart from the gate electrode. The deep trench isolation region is disposed adjacent to the drain region.

The insulating isolation region may be contoured to partially enclose each of the source regions.

Each of the well region and the gate electrode may have a rounded rectangle contour.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
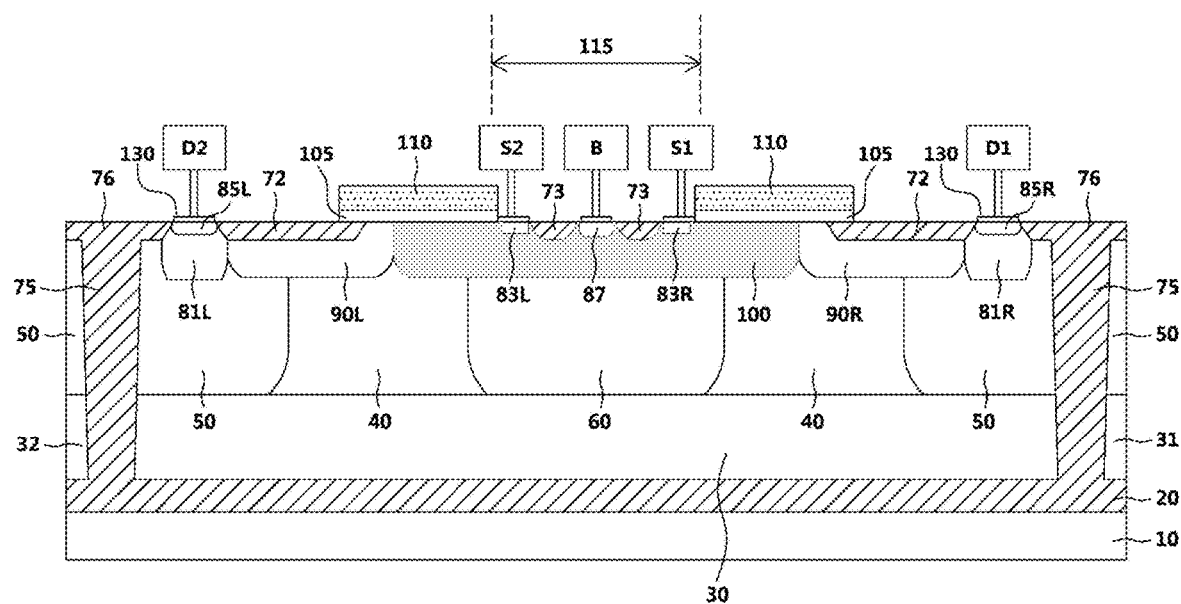
FIG. 1 is a cross-sectional view of an example of a semiconductor device of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

Hereinafter, examples of the present disclosure will be described with reference to the accompanying drawings. It will be described in detail focusing on the parts necessary to understand the operation and action according to the present disclosure. In describing the examples of the present disclosure, descriptions of technical features that are well known in the technical field and not related directly to the present disclosure will be omitted. This is to convey the idea more clearly without obscuring the subject matter of the present disclosure by omitting unnecessary description.

In addition, in describing the components of the present disclosure, different reference numerals may be given to components having the same name according to the drawings, and the same reference numerals may be given to different drawings. However, even in such a case, it does not mean that the corresponding components have different functions according to examples, or does not mean that they have the same functions in different examples. Judgment is to be made based on the description of each component in.

The semiconductor device, according to the example of the present disclosure, will be described in a case where it is applied to an Extended Drain MOS (EDMOS) transistor having N channels. In the following description, P-type may be referred to as a first conductivity type, and N-type may be referred to as a second conductivity type. Of course, the technical gist of the present disclosure can be equally applied to an EDMOS transistor having a P channel, and in the case of pEDMOS, the first conductivity type may be N-type and the second conductivity type may be P-type.

In addition, in the following description, when the substrate of the semiconductor device is P-type, the well region may be N-type, and according to another example, when the substrate is N-type, the well region may be P-type.

The present disclosure provides a semiconductor device in a high voltage semiconductor device with a controllable channel length, which is capable of securing a sufficient operating voltage, increasing an integration degree, and ensuring a breakdown voltage higher than the operating voltage.

Figure 6A:
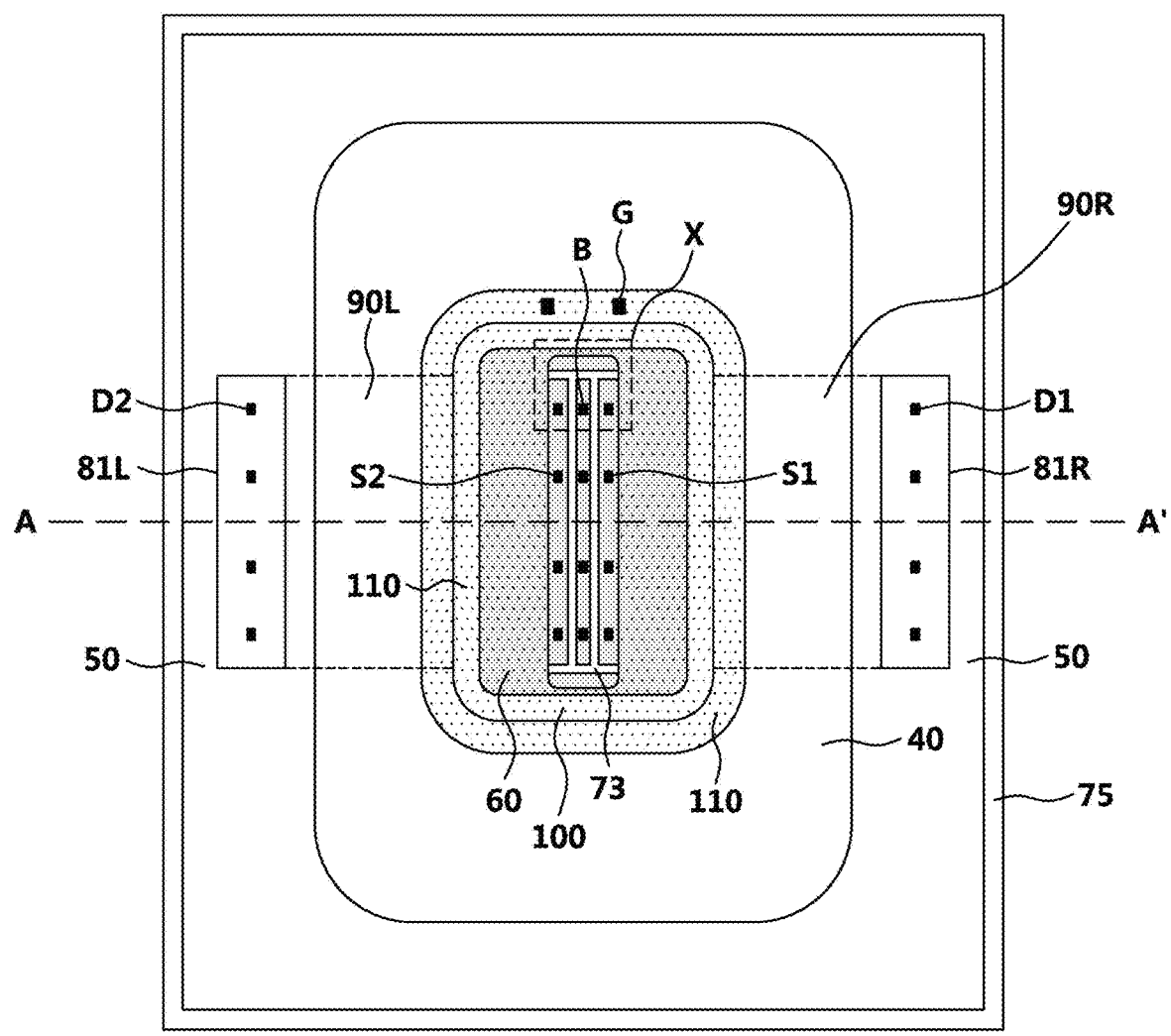
FIG. 6A is a top view of an example of a semiconductor device of the present disclosure.

FIG. 1 is a cross-sectional view of an example of a semiconductor device of the present disclosure. FIG. 6A is a top view of a semiconductor device of the present disclosure.

Referring to FIGS. 1 and 6A, the semiconductor device includes a substrate 10, a buried oxide layer 20, an N-type buried impurity layers (NBL) 30, 31 and 32, a P-type epitaxial layer (P-epi) 40, and an N-type deep well (DNW) 50, a P-type deep well (DPW) 60, N-type well (NW) 81L and 81R, a P-type well (PW) 100, a gate insulating film 105 and a gate electrode 110.

Referring to FIG. 1, the semiconductor device may include a buried oxide film (BOX) 20 disposed on the substrate 10, an NBL 30 disposed on the BOX 20, and the P-epi 40 disposed on the NBL 30. The semiconductor device further comprises the PW 100 in the shape of a corner-rounded rectangle on the P-epi 40 in a plan view (see FIG. 6A). NW 81L and 81R are spaced apart in the horizontal direction at a predetermined distance from the PW 100 on the P-epi 40 and surround the outside of the PW 100. The P-epi 40 is required in order to maintain a breakdown voltage (BVDSS, e.g., 260V) higher than the operating voltage (e.g., 200V). The area of the P-epi 40 becomes smaller by heat diffusion of the DNW 50 but is not eliminated.

Referring to FIG. 1, DNW 50 and DPW 60 are disposed on the lower surfaces of the NW 81L and 81R and the lower surface of the PW 100, respectively. As shown, the horizontal area (diameter) of the PW 100 is larger than the horizontal area (diameter) of the DPW 60. In addition, the concentration of the PW 100 is designed to be higher than the concentration of the DPW 60. The NW 81L and 81R are respectively disposed on a part of the upper surface of the DNW 50. DNW 50 and DPW 60 are respectively deeply formed such that the bottom surface of each deep well contacts the NBL 30. The DPW 60 may not be in contact with the NBL 30 when necessary.

Referring to FIG. 1, in addition, the semiconductor device may include a highly doped P-type (P+) bulk tap region 87 disposed on a portion of the upper surface of the PW 100. Highly doped N-type (N+) source regions 83L and 83R are spaced apart at a predetermined distance from both sides of the bulk tap region 87 on the upper surface of the PW 100. Highly doped N-type (N+) drain regions 85L and 85R are respectively disposed on a portion of the upper surface of the NW 81L and 81R, N-type drift regions 90L and 90R, the gate insulating film 105 and the gate electrode 110.

Referring to FIG. 1, two symmetrical EDMOS devices are formed around the bulk tap region 87. Although only two are shown in the present disclosure, more than two EDMOS devices may be arranged. The more EDMOS devices, the more current can flow. P-type may be referred to as a first conductivity type, and N-type may be referred to as a second conductivity type. The reverse is also possible.

Referring to FIG. 1, sides of the N-type drift (N-drift) regions 90L and 90R are formed to contact one side of the NW 81 and the side of the PW 100, respectively. As illustrated in FIG. 1, the N-drift regions 90L and 90R are formed in a quadrangular shape that borders one side of the NW 81 and the side of the PW 100.

Referring to FIG. 1, the gate insulating film 105 and the gate electrode 110 are formed to cover respective portions of the upper surface of the N-type drift regions 90L and 90R and a portion of the upper surface of the PW 100. The gate electrode 110 is formed in a rounded at each corner in a plan view (see FIG. 6A). Since the gate electrode 110 has a ring shape, an opening area 115 is formed in the center. Source regions 83L and 83R and bulk tap region 87 are formed in the opening area 115 of the gate electrode 110. The gate electrode 110 overlaps both the DPW region 60 and the PW region 100.

Referring to FIG. 1, portions of the upper surface of the semiconductor device are covered with a first insulating isolation region 72, a second insulating isolation region 73, and a third insulating isolation region 76. The first insulating isolation region 72 is formed to overlap the gate electrode 110. The first, second, and third insulating isolation regions 72, 73, and 76 may be formed through Shallow Trench Isolation (STI) process. The first, second, and third insulating isolation regions 72, 73, and 76 have a structure for effectively isolating the respective regions by opening portions of the bulk tap region 87, the source regions 83L and 83R, and the drain regions 85L and 85R. Hereinafter, in the present specification, the opening area for the bulk tap region of the insulating isolation region is referred to as the second isolation region 73. The first, second and third insulating isolation regions 72, 73, and 76 are respectively formed deeper than the bulk tap region 87, the source regions 83L and 83R, and the drain regions 85L and 85R, and formed shallower than the N-type drift regions 90L and 90R, the NW regions 81L and 81R and the PW region 100.

Referring to FIG. 1, the semiconductor device is isolated by the deep trench isolation region 75. The deep trench isolation region 75 is formed deeply and vertically to be in contact with the buried oxide film 20 from the upper surface of the insulating isolation region 76. Further, as shown in FIG. 6A, the deep trench isolation region 75 is formed as a closed-loop from a top view. The closed-loop of the deep trench isolation region 75 may have a polygonal shape such as a quadrangle, including the opening area 115 or may have a circular shape according to various examples. The deep trench isolation region 75 may be formed through a Deep Trench Isolation (DTI) process. That is, the semiconductor device is partitioned into the buried oxide film 20, the first, second, and third insulating isolation regions 72, 73, and 76, and the deep trench isolation region 75 to be isolated from the adjacent semiconductor devices. The insulating isolation region 76 is formed by overlapping each other with the deep trench isolation region 75. In order to minimize the chip area, the deep trench isolation region 75 is formed through the insulating isolation region 76. Therefore, the insulating isolation region 76 is formed by overlapping each other with the deep trench isolation region 75.

In summary, referring to FIG. 1 and FIG. 6A, the semiconductor device of the present disclosure includes a ring-shaped gate electrode 110 having an opening area 115 on a substrate; source regions 83L and 83R and a bulk tap region 87 formed in the opening area; an isolation region 73 completely surrounding the bulk tap region 87; a PW region formed to overlap the gate electrode; a drift region 90 formed in contact with the PW region; a first insulating isolation region 72 formed on the drift region and overlapping with the gate electrode; a drain region formed to be spaced apart from the gate electrode by a predetermined distance; and a deep trench isolation region surrounding the drain region.

Referring to FIG. 1 and FIG. 6A, the insulating isolation region 73 has a shape of II and includes a buried oxide film and a buried impurity layer formed on the substrate; a DPW region formed to be in contact with the PW region and the buried impurity layer; and an DNW region formed to be in contact with the drift region and the buried impurity layer.

The deep trench isolation region is deeper than the insulating isolation region and is formed in contact with the buried oxide layer.

Figure 2:
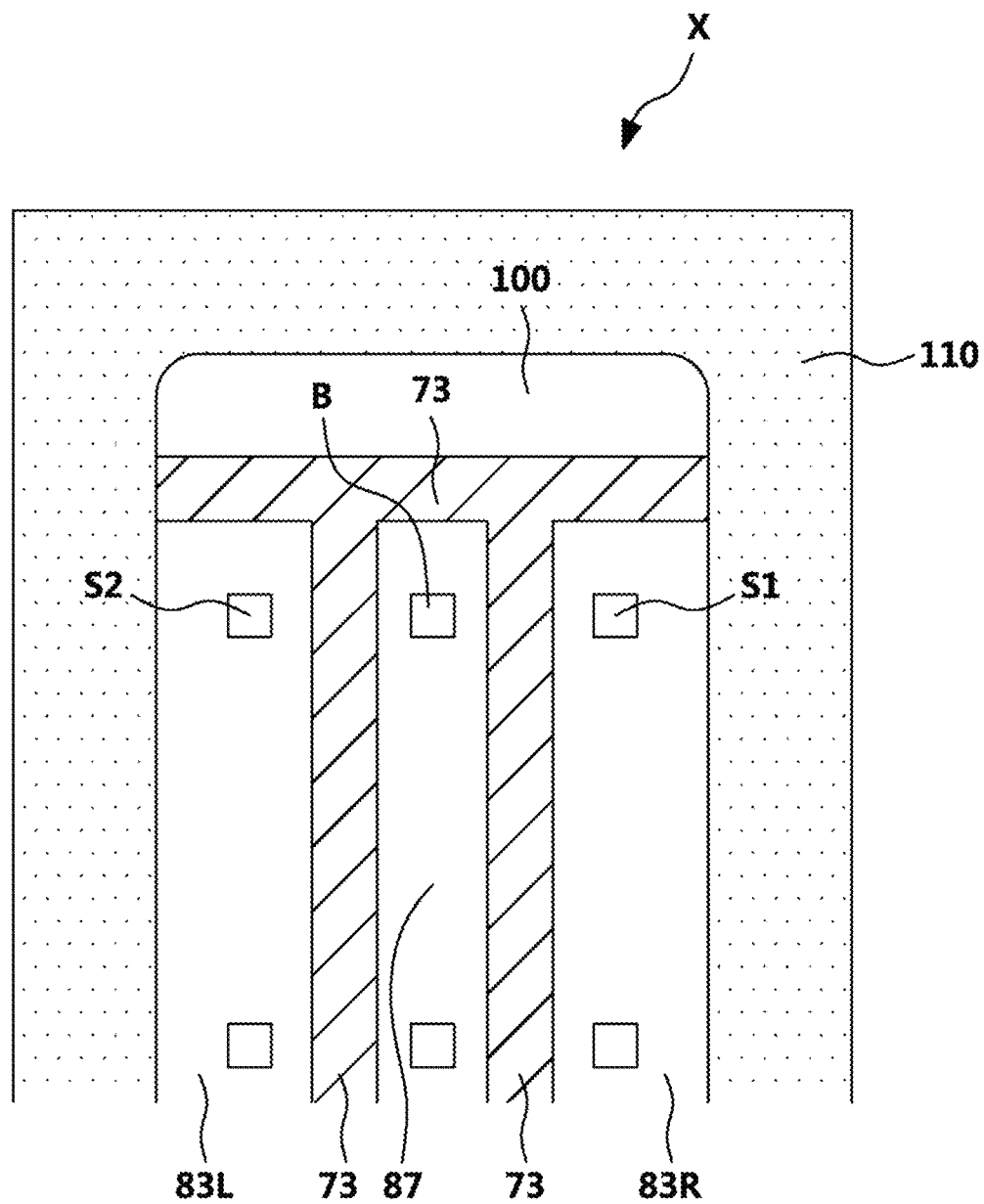
FIG. 2 is an enlarged top view illustrating an example of a source region and a bulk tap region in the semiconductor device of the present disclosure.

FIG. 2 is an enlarged top view illustrating a source region and a bulk tap region in the semiconductor device of the present disclosure.

Referring to FIG. 2, the first, second, and third insulating isolation regions 72, 73, and 76 are patterned to have openings for the bulk tap region 87 and the source regions 83L and 83R. EDMOS requires that the bulk tap region 87 be isolated from the source regions 83L and 83R, unlike LDMOS. For this, the second insulating isolation region 73 is formed between the source regions 83L and 83R and the bulk tap region 87. The second insulating isolation region 73 completely surrounds the bulk tap region 87. Here, the first source region 83L and the second source region 83R are formed respectively on both sides of the bulk tap region 87.

Referring to FIG. 2, the second insulating isolation region 73 has a shape of 'II' in a top view. The second insulating isolation region 73 has a closed-loop to isolate the bulk tap region 87 from the source regions 83L and 83R. A bulk tap region 87 is disposed inside the closed-loop. A plurality of bulk terminals B connected to the bulk tap region 87 is also disposed inside the closed-loop. The source regions 83L and 83R are disposed outside the closed-loop. The source regions 83L and 83R are connected to the plurality of source terminals S1 and S2.

The second insulating isolation region 73 is formed over the DPW region 60 and the epitaxial layer 40. A shallow trench isolation or middle trench isolation or LOCOS is used for the second insulating isolation region 73. Insulation materials such as silicon oxide, HDP, etc., are filled into the shallow trench isolation.

FIGS. 3A to 5B are cross-sectional views illustrating an example of a method for manufacturing a semiconductor device of the present disclosure.

Figure 3A:
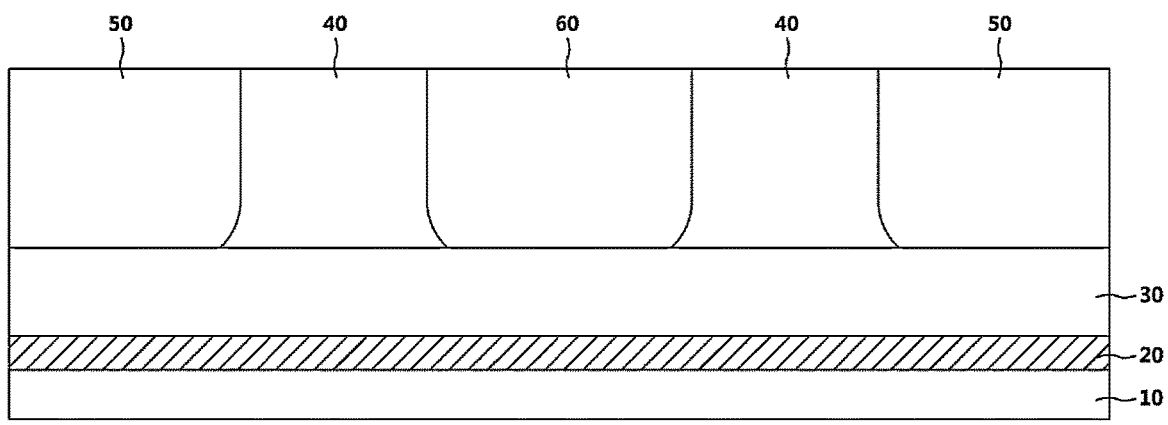
FIGS. 3A to 5B are cross-sectional views illustrating a method for manufacturing an example of a semiconductor device of the present disclosure.

Referring to FIG. 3A, a buried oxide film (BOX) 20 is formed on a substrate 10, and an NBL 30 is formed on the BOX 20. The NBL 30 serves to improve the breakdown voltage characteristic of the EDMOS transistor, and the impurity doping concentration of the NBL 30 is desirably higher than the impurity doping concentration of the DPW region 60 and the DNW region 50.

Referring to FIG. 3A, a P-epi 40 is formed on the NBL 30. A thickness of the epitaxial layer 40 is higher than a thickness of the NBL 30.

Referring to FIG. 3A, the DPW region 60 is vertically deeply formed to be in contact with the bottom surface of the P-epi 40, that is, the NBL 30. The DNW region 50 is also formed vertically deep from the top surface of the P-epi 40 to be in contact with the bottom surface, that is, the NBL 30.

Referring to FIG. 3A, when the DPW region 60 and the DNW region 40 are formed to be in contact with the upper surface of the NBL 30, the electrical potential profile is stably formed. In addition, since the DNW region 40 surrounds the outermost portion of the semiconductor device, the breakdown voltage is stabilized.

Figure 3B:
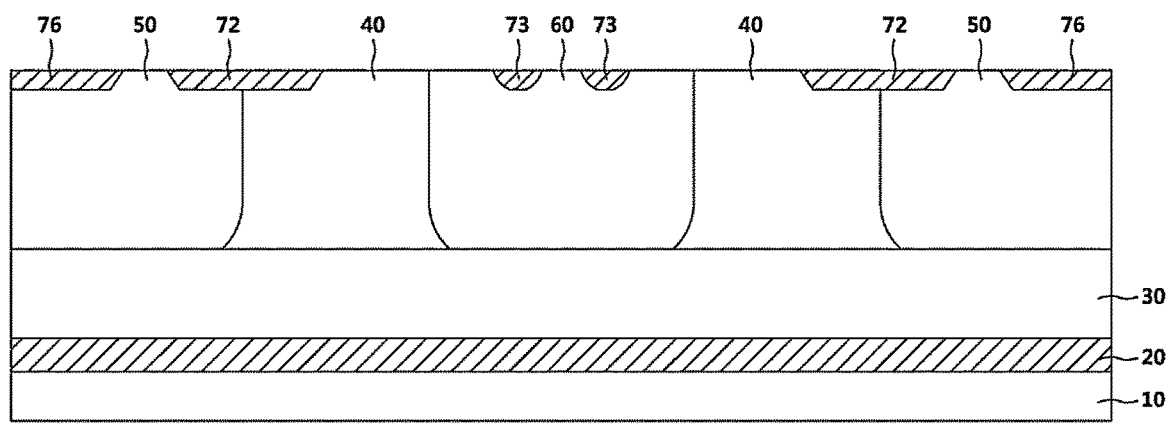

Referring to FIG. 3B, the first, second, and third insulating isolation regions 72, 73, and 76 are formed on the substrate 10. The first, second, and third insulating isolation regions 72, 73, and 76 are formed in a Shallow Trench Isolation (STI) type, a Middle Trench Isolation (MTI) process, or a LOCOS process. The insulating isolation region 73 formed in the middle of the insulating isolation regions 72, 73, and 76 is formed to isolate the source region, and the bulk tap region or to isolate another semiconductor device disposed adjacent to the present semiconductor device.

Figure 4A:
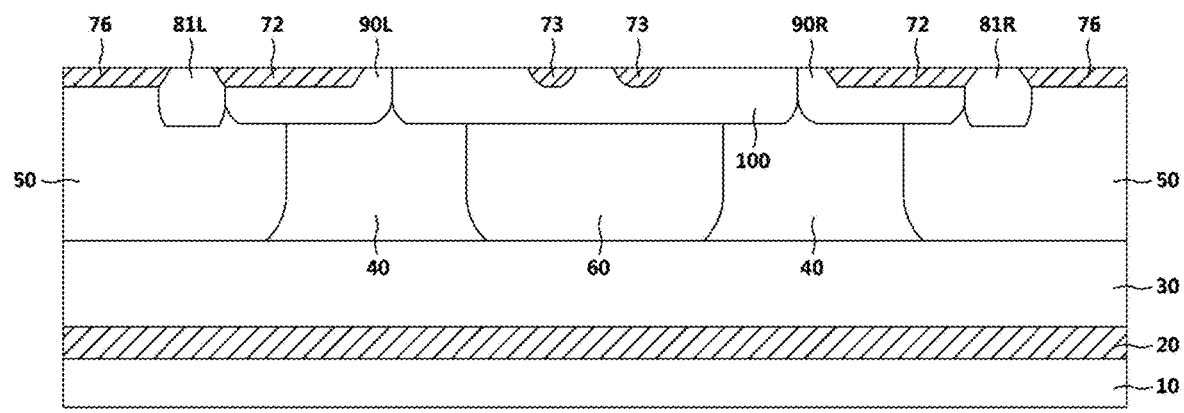

Referring to FIG. 4A, a PW region 100 is formed under the insulating isolation regions 73 in a central portion. The depth of the PW region 100 is formed to contact the DPW region 60. The PW region 100 is formed to have a longer width than a width of the DPW region 60 in a horizontal direction parallel to a top surface of the substrate 10. The PW region 100 has a round shape at each corner in a top view (see FIG. 6A).

Referring to FIG. 4A, NW regions 81L and 81R are formed on the DNW region 50. The NW regions 81L and 81R are formed in a horizontal length (diameter) to be narrower than the DNW region 50. The NW regions 81L and 81R have a rectangular shape in a top view (see FIG. 6A).

Referring to FIG. 4A, in addition, drift regions 90L and 90R are respectively formed at both sides of the PW region 100. The drift regions 90L and 90R also contact the NW regions 90L and 90R in the channel length direction. The drift regions 90L and 90R are formed of N-type impurities, and form a junction region with the PW region 100.

Figure 4B:
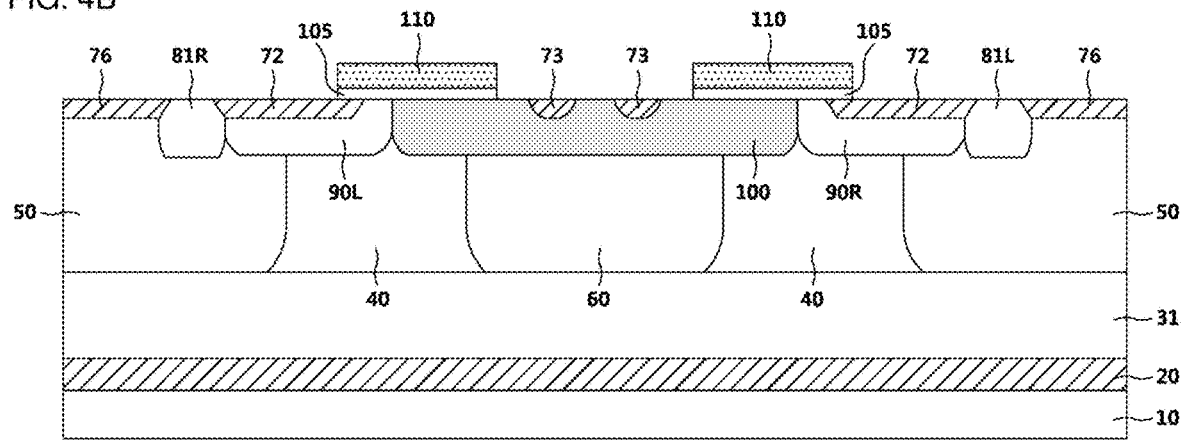

Referring to FIG. 4B, a gate insulating film 105 and a gate electrode 110 are disposed on the semiconductor device.

The gate insulating film 105 and the gate electrode 110 are disposed on a portion of the upper surface of PW region 100 and a portion of the upper surface of the drift regions 90L and 90R. The gate electrode 110 has a ring-type shape. So the gate electrode 110 has an open area in which the insulating isolation region 73, the bulk tap region 87, and the source regions 83L and 83R are formed therein.

Figure 5A:
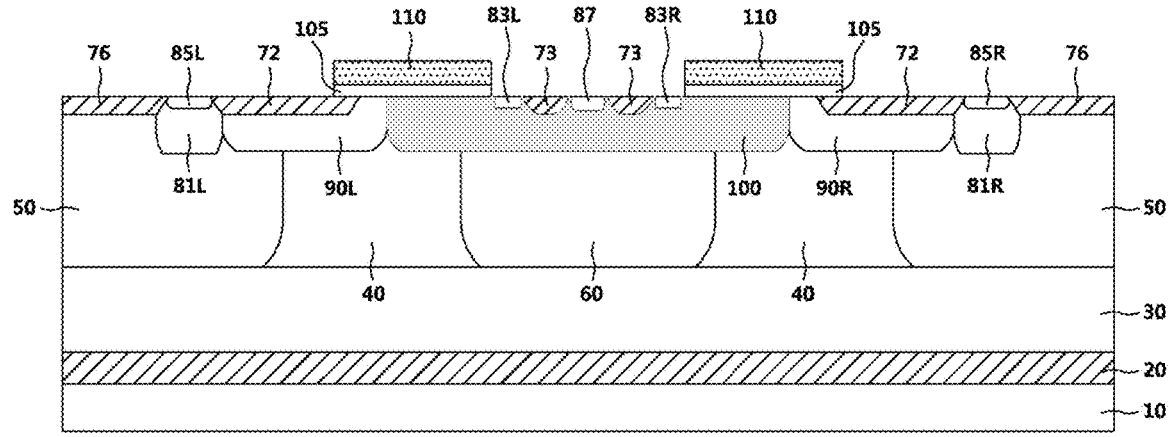

Referring to FIG. 5A, P-type impurities are implanted into the PW region 100 to form a P-type bulk tap region 87 to input a bias to the PW region. In addition, N-type impurities are implanted into openings of the insulating isolation regions 72 and 76 in the substrate 10 to form N-type source regions 83L and 83R and drain regions 85L and 85R. The N-type drain regions 85L and 85R are in contact with one side of the drift regions 90L and 90R.

The drain regions 85L and 85R, the source regions 83L and 83R, and the bulk tap region 87 has a depth shallower than depths of the insulating isolation regions 72, 73, and 76, the PW region 100 and the NW regions 81R and 81L.

Figure 5B:
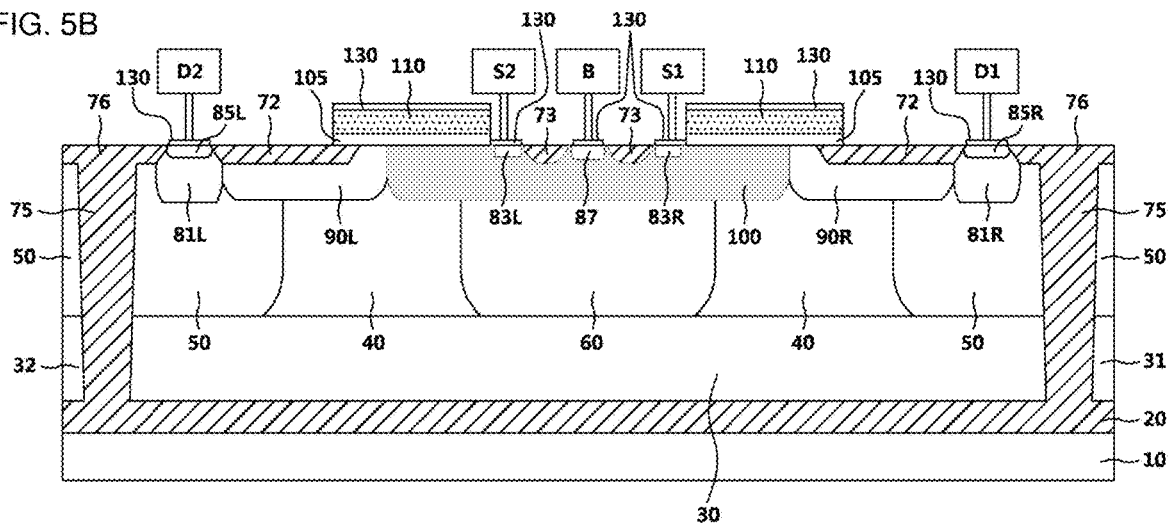

Referring to FIG. 5B, silicide layers 130 are formed on the drain regions 85L and 85R, the source regions 83L and 83R, and the bulk tap region 87 and on the gate electrodes 126 to reduce contact resistance between tungsten (W) plug and the substrate 10 or gate electrode 110. The silicide layers 124 include, for example, titanium silicide or cobalt silicide or nickel silicide.

Referring to FIG. 5B, the semiconductor device may be isolated from other adjacent semiconductor devices by forming the deep trench isolation region 75 vertically deep. The deep trench isolation region 75 may be formed by using a Deep Trench Isolation (DTI) process and is in contact with the BOX 20. The deep trench isolation region 75 overlaps with the third insulating isolation region (or STI) 76. The deep trench isolation region 75 is formed through the third insulating isolation region (or STI) 76 to facilitate the process and to reduce the chip area.

Further, a deep trench isolation (DTI) process for isolating a device is performed after a gate electrode 110 or a silicide structure 130 is formed in the manufacturing process of the semiconductor device. Since the process of forming a DTI structure is performed after the silicide process, it is possible to prevent various defects caused by an annealing process performed after the DTI process and to reduce the number of steps in the manufacturing process of the semiconductor device in which the DTI structure is formed. As a result, with this example, it is possible to reduce a manufacturing time and cost.

The drain regions D1 and D2, the source terminals S1 and S2, the bulk terminal B, and the gate terminal G are connected to the drain regions 85L and 85R, the source regions 83L and 83R, the bulk tap region 87, and the gate electrode 110, respectively. The drain regions D1 and D2, the source terminals S1 and S2, the bulk terminal B, and the gate terminal G may be formed by tungsten plug or Cu or Cu—Al metal.

Figure 6B:
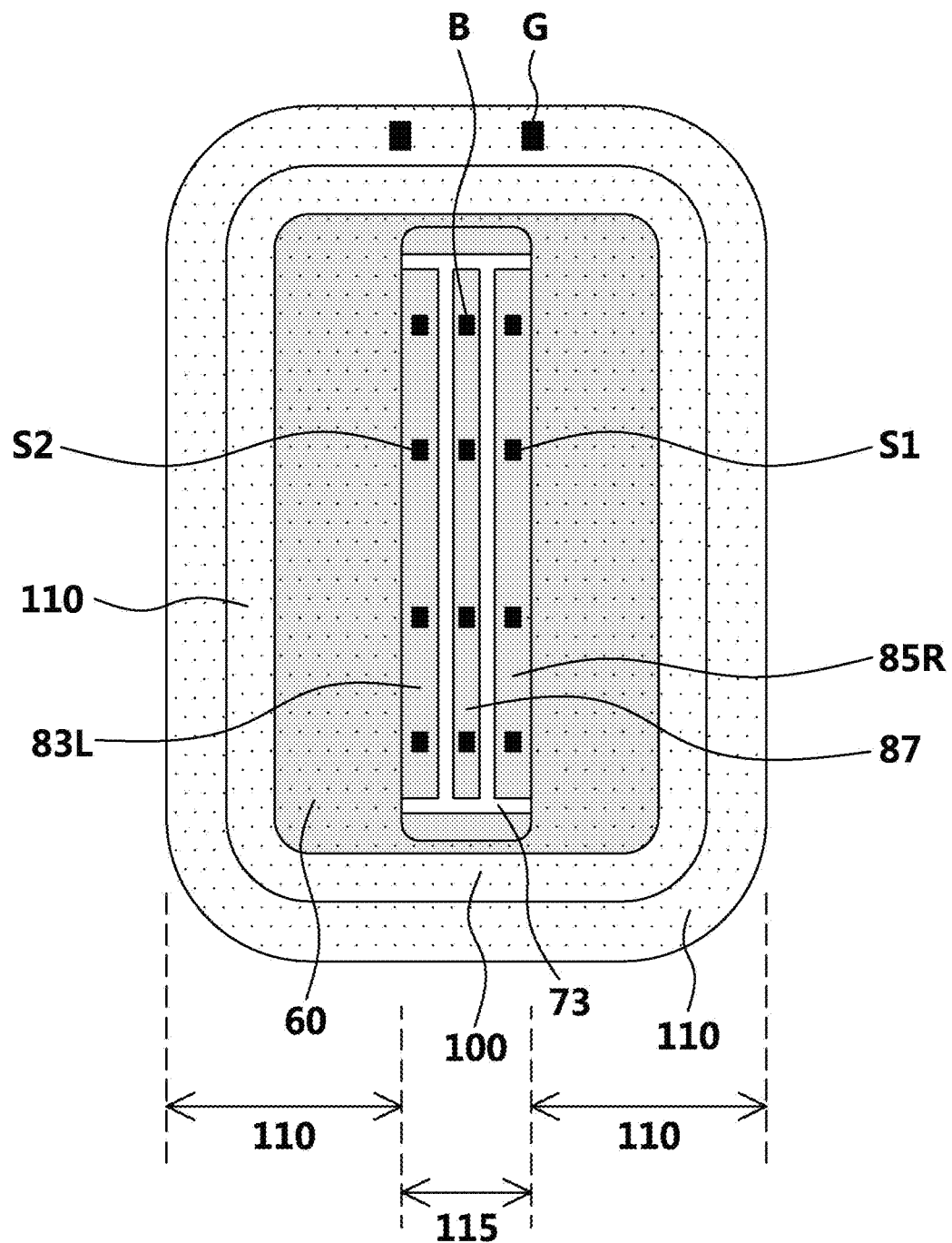
FIG. 6B is an enlarged top view of the central portion of FIG. 6A.

FIG. 6A is a top view according to the example of the semiconductor device of the present disclosure, and FIG. 6B is an enlarged top view of the central portion of FIG. 6A.

Referring to FIG. 6A, a semiconductor device may include a DPW 60, a P-type well (PW) 100, a gate electrode 110, an NW 81L and 81R, and an N-type deep well (DNW) 50. The vertices of the rectangle may be designed as a rounded vertex having a constant curvature so that the DPW 60, the PW region 100, the gate electrode 110, and the DNW region 50 have a rounded rectangular shape at each corner, thereby relieving the concentration of the electric field at each corner. The larger the radius of curvature, the better the breakdown voltage (BV) maintenance may be. This may enable the breakdown voltages to be implemented to be potentially more than 280V or even 400V. Referring to FIG. 6A, the deep trench isolation region 75 surrounds the semiconductor device by a closed-loop shape.

Referring to FIG. 6B, a top view of the ring-type gate electrode 110 has rounded corner having a constant curvature K. It is formed to have a constant radius of curvature at each corner. The ring-type gate electrode 110 has an opening 115.

Referring to FIG. 6B, the insulating isolation region 73 may have a Roman character II in a top view. The insulating isolation region 73 is formed of a closed-loop to isolate the bulk tap region 87 from the source regions 83L and 83R. In the form of Roman character II, a bulk tap region 87 and a plurality of bulk terminals B in the bulk tap region are disposed inside the closed-loop. In the form of Roman character II, source regions 83L and 83R and a plurality of source terminals S1 and S2 in the source region are disposed outside the closed-loop.

Figure 7:
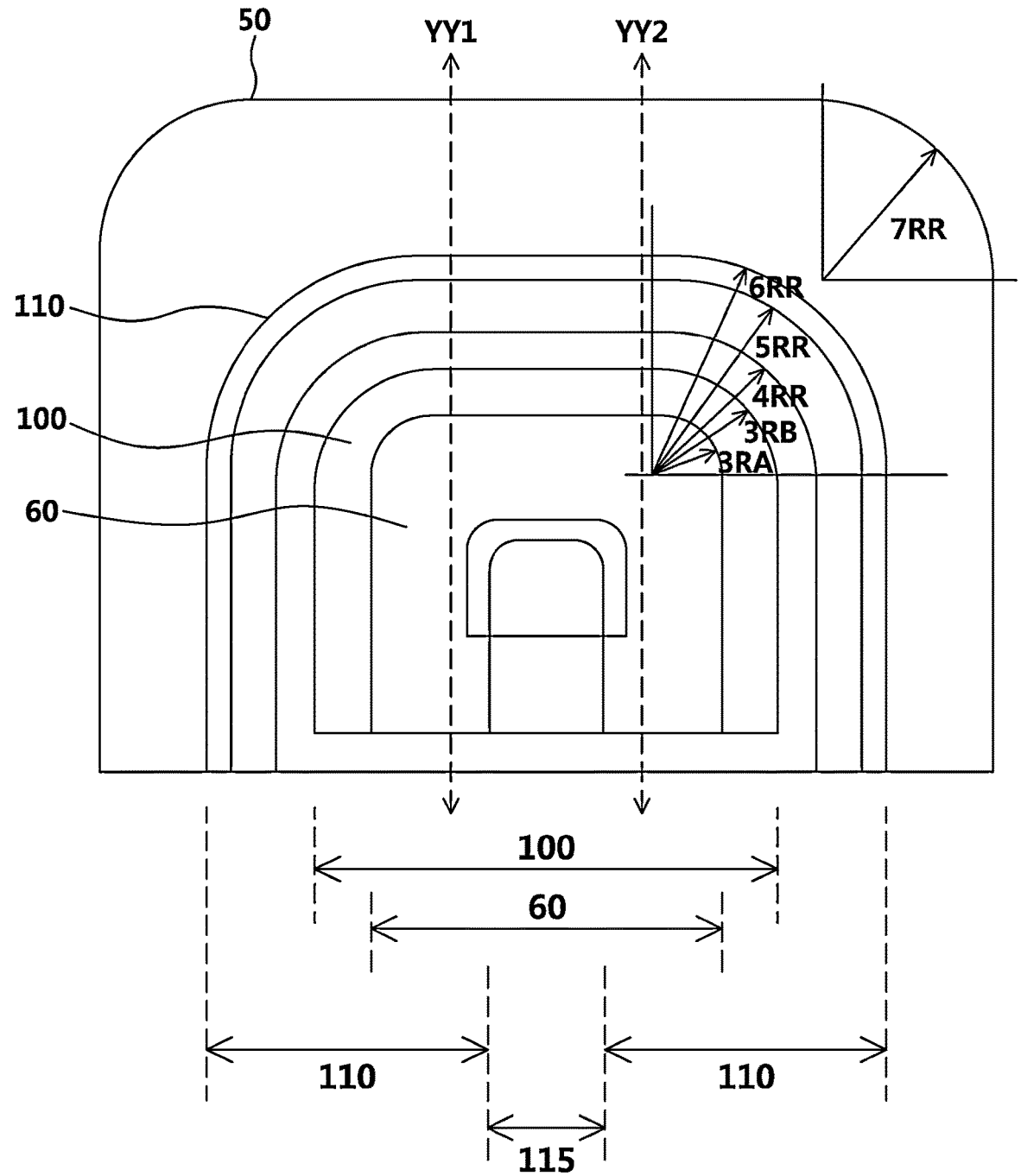
FIG. 7 is a top view illustrating the curvature of corners in the semiconductor device illustrated in FIG. 6A.

FIG. 7 is a top view illustrating the curvature of corners in the semiconductor device illustrated in FIG. 6A.

Referring to FIG. 7, the DPW 60 is formed to have a rounded contour with a constant curvature K so that each corner of the top view is not rectangular. For example, it is formed in the shape of a rounded rectangle. It is formed to have a constant radius of curvature 3RA in each corner region.

Referring to FIG. 7, the PW region 100 is also formed to have a rounded contour with a constant curvature K so that each corner of the top view is not rectangular. For example, it is formed in the shape of a rounded rectangle. It is formed to have a constant radius of curvature 3RB in each corner region.

Referring to FIG. 7, the gate electrode 110 is formed to have a rounded contour with a constant curvature K so that each corner is not rectangular in the top view. That is, the gate electrode 110 has a rounded rectangular ring having the opening 115. It is formed to have a constant radius of curvature 6RR in each corner region. Assuming that the corner of the gate electrode 110 has a first radius of curvature 6RR, and the corner of the PW region 100 has a second radius of curvature 3RB, the first radius of curvature 6RR is greater than the second radius of curvature 3RB. In addition, the corner of the DPW 60 has a third radius of curvature 3RA. The second radius of curvature 3RB is greater than the third radius of curvature 3RA. When the radius of curvature is increased, angled parts of the corners are eliminated so that it is easier to be formed in the manufacturing process and easier to maintain breakdown voltage (BVDSS).

Referring to FIG. 7, the DNW (N-type deep well) region 50 surrounds the DPW (P-type deep well) 60. The DNW region 50 is spaced apart from the DPW 60. That is, the DNW region 50 is a ring shape having an open area in a center region. The DNW region 50 is also formed rounded with a constant curvature K so that each corner is not rectangular. The DNW region 50 is also formed to have a constant radius of curvature 7RR at each corner.

Referring to FIG. 7, the dotted line YY1 or YY2 vertically passes the DPW 60, the PW region 100, and the gate electrode 110 in a plan view (top view). The channel length is increased by extending the dotted line YY1 toward left direction. The channel length is also increased by extending the dotted line YY2 toward right direction. The dotted line YY1 or YY2 are starting lines to change the channel length. It will be explained in detail in FIGS. 8A and 8B. The overlapping portion where the PW region 100 and the gate electrode 110 overlap each other is used to extend or shrink the channel length.

Referring to FIG. 7, the semiconductor device includes a ring-shaped gate electrode 110 having an opening area 115 on a substrate; source regions 83L and 83R formed in the opening area; a PW region 100 formed to overlap with the gate electrode; and drain regions 85L and 85R formed spaced apart at a predetermined distance from the gate electrode, wherein the corner of the gate electrode has a first radius of curvature (6RR), the corner of the PW region 100 has the second radius of curvature 3RB, and the first radius of curvature 6RR is greater than the radius of curvature 3RB.

Referring to FIG. 7, the semiconductor device further includes a DPW 60 under the PW region 100, and wherein a corner of the DPW 60 has a third radius of curvature 3RA and the second radius of curvature 3RB is greater than the third radius of curvature 3RA. The semiconductor device further includes an insulating isolation region 72 formed to overlap the gate electrode 110, and a deep trench isolation region 75 surrounding the gate electrode, wherein the depth of the deep trench isolation region 75 is deeper than that of the insulating isolation region 72.

Figure 8A:
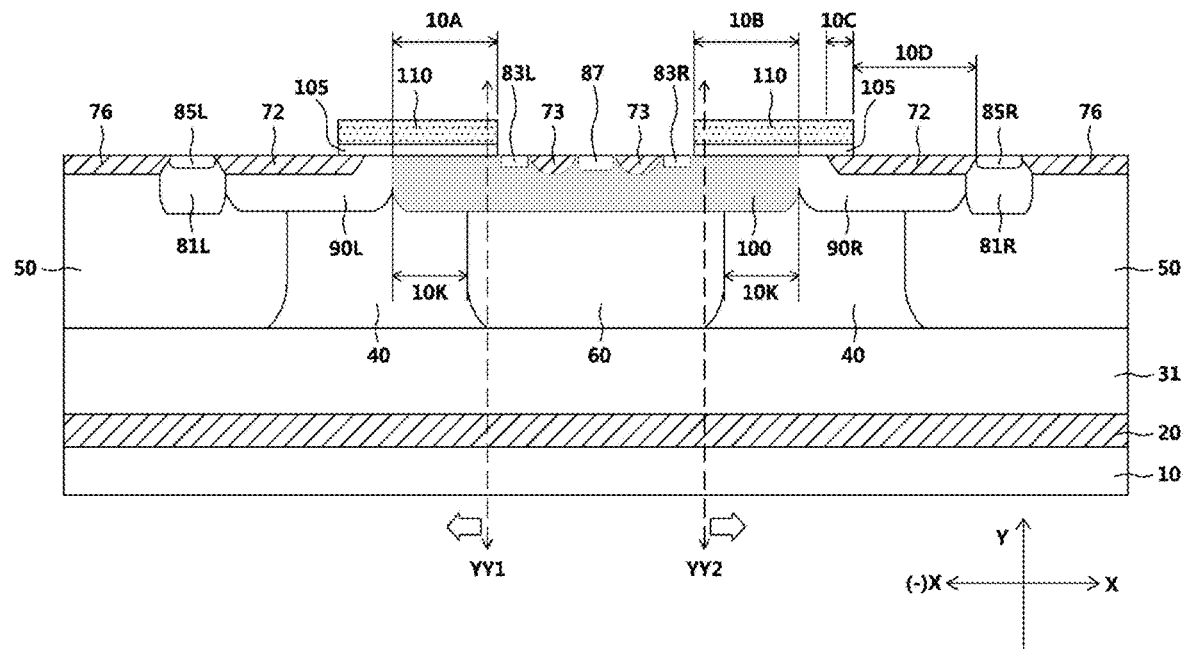
FIG. 8A is a cross-sectional view of an example of a semiconductor device with a controllable channel length.
Figure 8B:
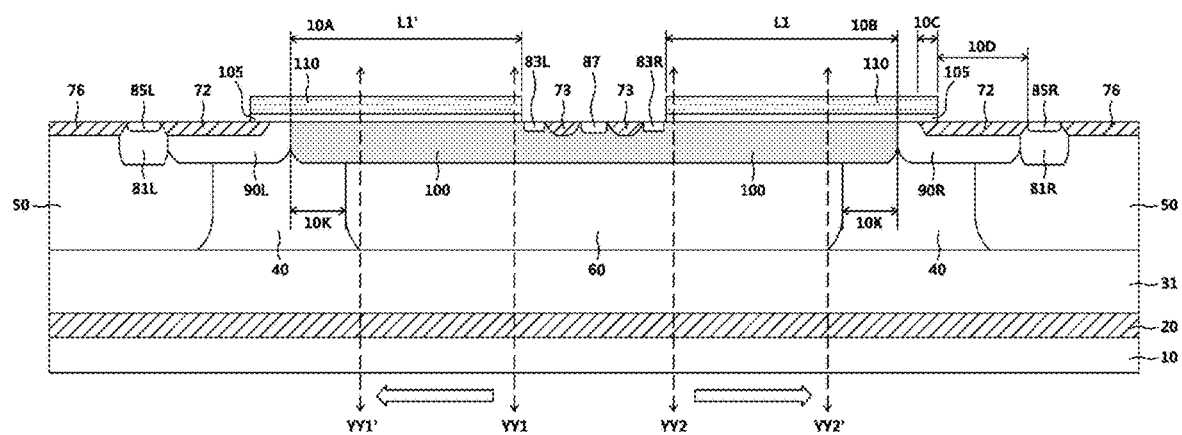
FIG. 8B is a cross-sectional view of an example of a semiconductor device after increasing the channel length.

FIG. 8A is a cross-sectional view of an example of a semiconductor device with a controllable channel length. FIG. 8B is a cross-sectional view of an example of a semiconductor device after increasing the channel length.

Unlike alternative round typed DMOS, the EDMOS device of the present disclosure can be used as an analog device because the channel length is easily controllable.

Referring to FIG. 8A, the length '10B' is a distance from the left edge of the gate electrode 110 to the right edge of the PW region 100. The length '10B' may correspond to a channel length. The effective channel length is the distance from the source region 83R to the right edge of the PW region 100. The right edge of the PW region 100 is in contact with the N-type drift region 90R. The length '10A' is a distance from the right edge of the left gate electrode 110 to the left edge of the PW region 100. The left edge of the PW region 100 is in contact with the N-type drift region 90L. The length '10K' is a distance from the right edge of the DPW 60 to the right edge of the PW region 100. The length '10D' is a distance from the right edge of the gate electrode 110 to the drain region 85R.

Referring to FIGS. 8A and 8B, the dotted line YY1 or YY2 vertically pass the DPW 60, the PW region 100 and the gate electrode 110 in a cross-sectional view. The channel length is increased by extending from the dotted line YY1 to YY1'. The channel length is also increased by extending from the dotted line YY2 to YY2'. As a result, a new channel length L1 or L1' is obtained, as shown in FIG. 8B. The dotted line YY1 or YY2 is the starting line to change the channel length of the device. By extending the DPW 60, the PW region 100 and the gate electrode 110 in X-direction, each length of the DPW 60, the PW region 100, and the gate electrode 110 is increased, as shown in FIG. 8B.

The channel length is not related to the gap between the YY1 and YY2. The lengths of 10K and 10D do not change. The lengths of 10K and 10D may have fixed values. If the length '10D' is changed, the breakdown voltage (BVDSS) and the on-resistance (Ron) are also varied. The same applies to 10K. The lengths of all portions other than the portion where the DPW 60, the PW region 100, and the gate electrode 110 overlap may be fixed. Therefore, the DPW 60, the PW region 100, and the gate electrode 110 may maintain a constant curvature.

When the curvature changes as the channel length vary, the drain current gradually increases with the drain voltage that it cannot be used as an analog device. Therefore, the curvature must be kept constant even if the channel length varies so that the drain current can be constant that it is suitable for use as an analog device.

Figure 9:
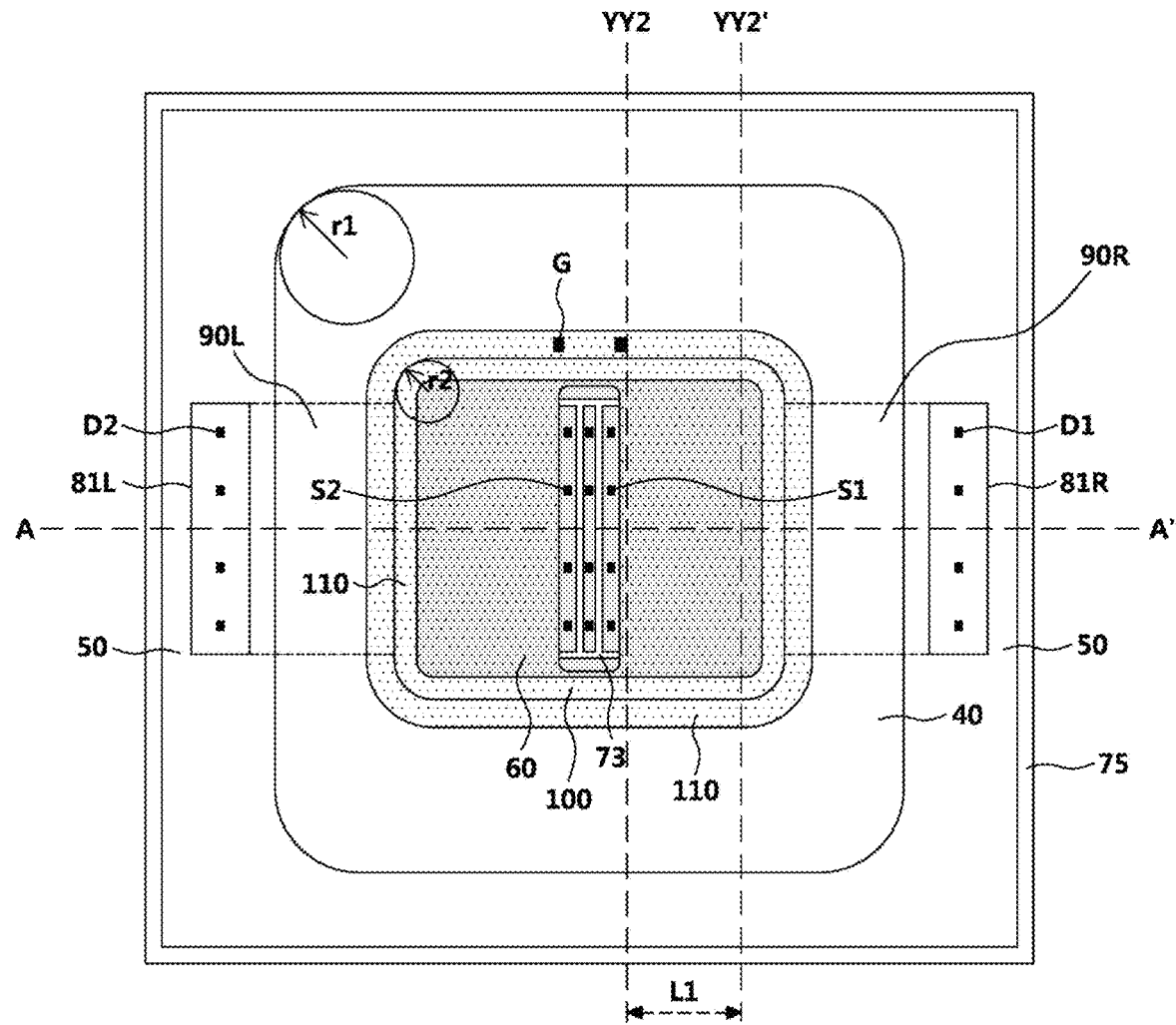
FIGS. 9 to 11 are top views according to other examples of the semiconductor device of the present disclosure, in which channel length is controllable.
Figure 10:
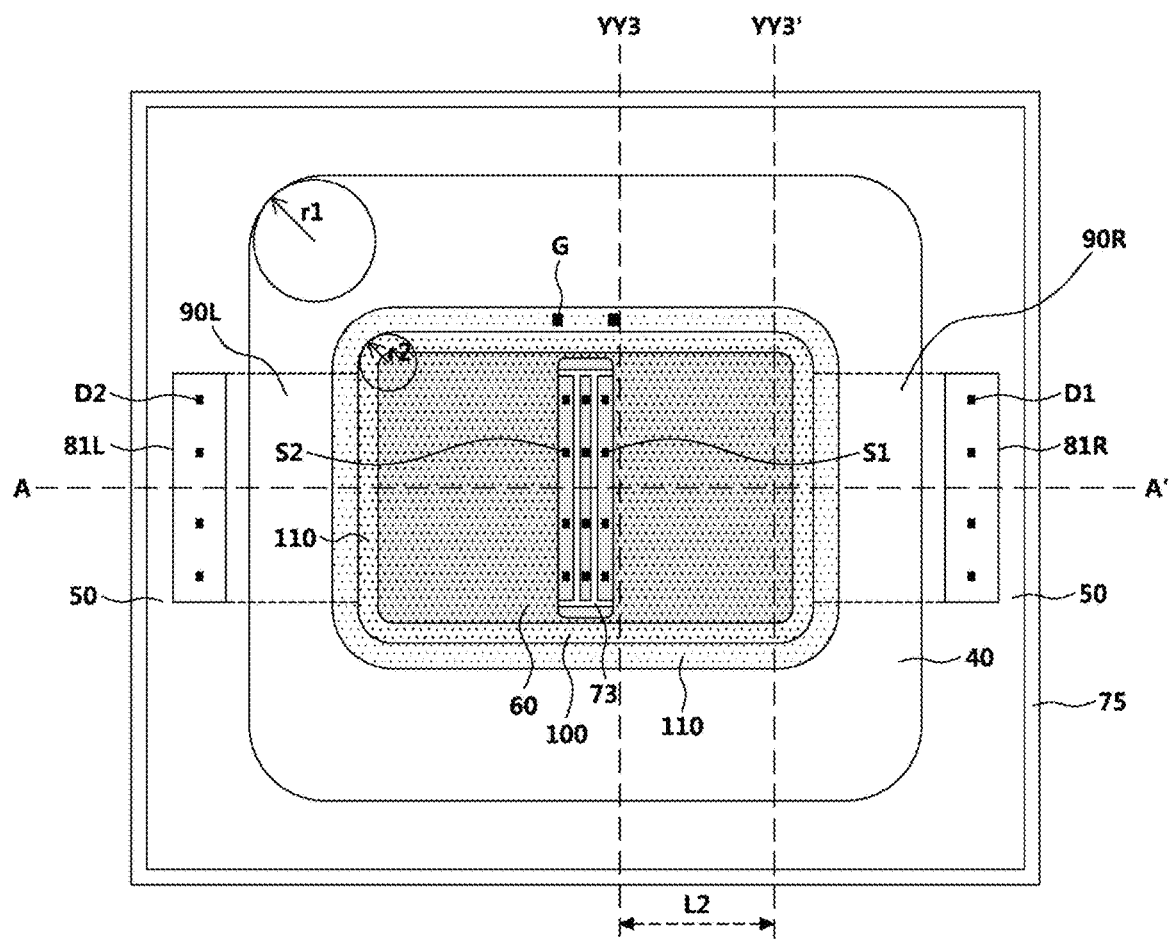
Figure 11:
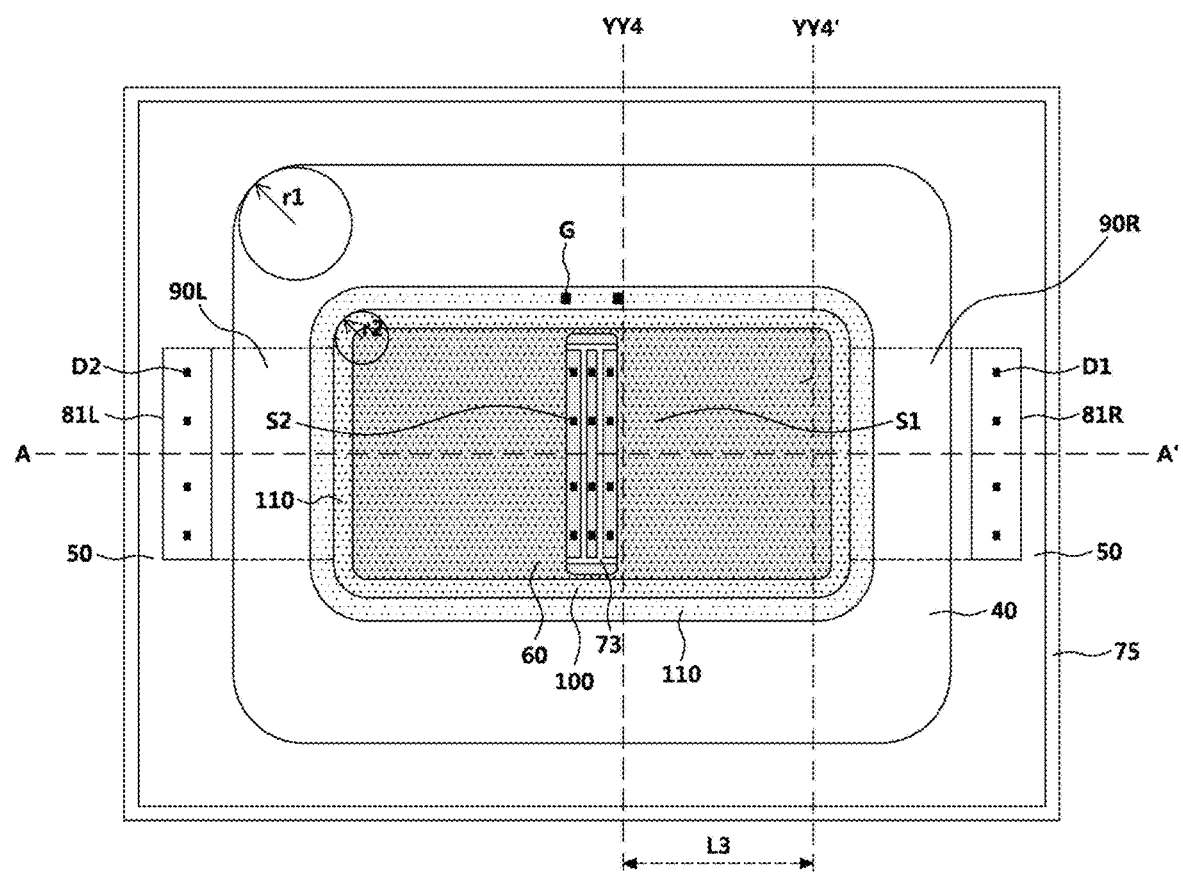

FIGS. 9 to 11 are cross-sectional views of examples of the semiconductor device with a controllable channel length of the present disclosure.

FIG. 9 is a top view according to the second example of the semiconductor device of the present disclosure, FIG. 10 is a top view according to the third example of the semiconductor device of the present disclosure, and FIG. 11 is a top view according to a fourth example of the semiconductor device of the present disclosure.

The semiconductor device according to the examples of the present disclosure may prevent the electric field from being concentrated by designing a rectangular vertex to have a round type with a constant curvature such that the DPW 60, the PW region 100, the gate electrode 110, and the DNW region 50 have a rounded rectangular shape.

As shown in FIG. 9, the channel length L1 is obtained by extending the dotted line YY2 to YY2'. In the same manner, as shown in FIG. 10, a channel length L2 is obtained by extending the dotted line YY3 to YY3'. As shown in FIG. 11, the channel length L3 is obtained by extending the dotted line YY4 to YY4'. Herein, a horizontal length of the gate electrode 110 is greater than a vertical length of the gate electrode 110 in as shown in FIG. 10 or 11.

However, even if the length of the X-axis is varied as shown in FIGS. 9 to 11, the radius of curvature (R1, R2) of the corner edge of the square is maintained uniformly. For example, even if the channel length increases, the radius of curvature R1 of the DNW region 50 and the radius of curvature R2 of the PW region 100 are maintained constant. Electrical characteristics of the semiconductor device may vary depending on the radius of curvature. Therefore, it is desirable to maintain the radius of curvature constant.

Figure 12:
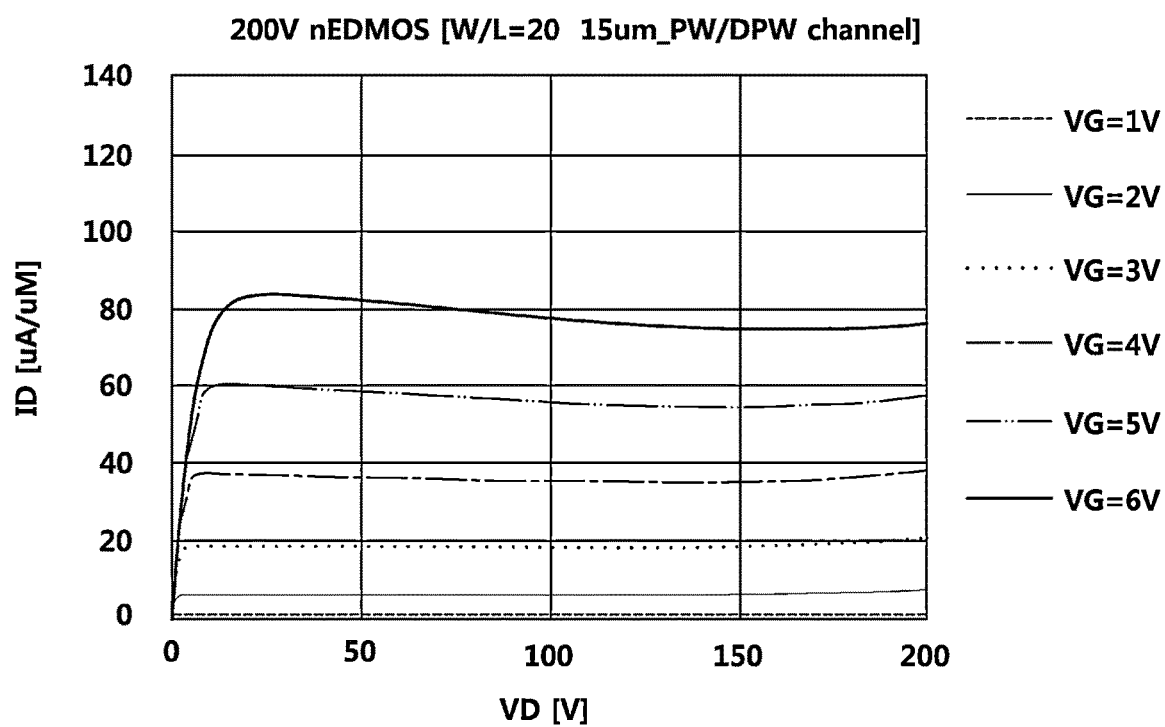
FIG. 12 shows a voltage-current graph according to the operation of the semiconductor device of the present disclosure.

FIG. 12 illustrates a voltage-current graph according to the operation of the semiconductor device.

Referring to FIG. 12, even when the drain voltage is stably applied to 200V, the current in the drain is stably supplied. In other words, the current characteristics are excellent that the operation characteristics of the semiconductor device are improved. The semiconductor device of the present disclosure cannot be used as an analog device when the curvature is changed as the length of the existing round type channel varies because the drain current gradually increases with the drain voltage. Therefore, it is suitable for use as an analog device by keeping the curvature constant even if the channel length varies, and keep the drain current at a constant value. That is, unlike DMOS, the channel is controllable to be used as an analog device.

The semiconductor device of the present disclosure includes a structurally deep trench type isolation film, thereby having higher breakdown voltage characteristics than isolating the adjacent active regions using a junction isolation technique. Accordingly, the operating voltage characteristics and the degree of integration of the high voltage semiconductor device may be improved effectively.

In addition, the present disclosure may reduce the on-resistance of the semiconductor device by reducing the total area of the semiconductor device, thereby improving the operating characteristics of the semiconductor device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a semiconductor device, the method comprising:
   forming an N-type buried layer in a substrate;
   forming a P-type deep well region and an N-type deep well region on the N-type buried layer, wherein the P-type deep well region is surrounded by a P-type epitaxial layer;
   forming a P-type well region and an N-type well region on the P-type deep well region and the N-type deep well region, respectively, wherein the P-type well region has a width greater than that of the P-type deep well region in a horizontal direction parallel to an upper surface of the substrate;
   forming a gate electrode having a closed-loop in which an opening area is formed in a central region, the gate electrode overlapping the P-type well region and the P-type deep well region;
   forming a source region and a drain region in the P-type well region and the N-type well region, respectively;
   forming silicide layers on the source and drain regions; and
   forming a deep trench isolation region surrounding the silicide layers and the gate electrode,
   wherein the deep trench isolation region is formed after the silicide layers are formed on the source and drain regions, and
   wherein the deep trench isolation region is formed vertically to abut the N-type deep well region and the N-type buried layer.

2. The method of claim 1, further comprising forming a buried oxide layer disposed under the N-type buried layer, wherein the deep trench isolation region is in direct contact with an upper surface of the buried oxide layer.

3. The method of claim 1, further comprising:
   forming a first insulating isolation region to partially overlap the N-type deep well region;
   forming a second insulating isolation region in the P-type deep well region; and
   forming a third insulating isolation region in the N-type deep well region.

4. The method of claim 1, wherein the P-type deep well region is spaced apart from the N-type deep well region, and each of the P-type deep well region and the N-type deep well region is in direct contact with an upper surface of the N-type buried layer.

5. The method of claim 1, wherein the P-type epitaxial layer, the P-type well region and the gate electrode overlap each other.

6. The method of claim 1, wherein the gate electrode comprises:
   first to fourth corners, each corner having a round shape;
   a first straight section between the first corner and the second corner;
   a second straight section between the third corner and the fourth corner, the first and second straight sections being parallel to each other; and
   a vertical axis passing through the first and second straight sections simultaneously and not overlapping the opening area, and
   wherein a channel length of the semiconductor device is extendable to a desired length about the vertical axis.

7. A method of manufacturing a semiconductor device, the method comprising:
   forming a buried oxide layer on a substrate,
   forming an N-type buried layer on the buried oxide layer;
   forming a P-type deep well region and an N-type deep well region on the N-type buried layer, wherein the P-type deep well region is surrounded by a P-type epitaxial layer;
   forming a first insulating isolation region, a second insulating isolation region, and a third insulating isolation region on the substrate, respectively;
   forming a P-type well region and an N-type well region on the P-type deep well region and the N-type deep well region, respectively, wherein the P-type well region has a width greater than that of the P-type deep well region in a horizontal direction parallel to an upper surface of the substrate;
   forming a gate electrode having a closed-loop in which an opening area is formed in a central region, the gate electrode overlapping the P-type well region and the P-type deep well region;
   forming a source region and a drain region in the P-type well region and the N-type well region, respectively;
   forming silicide layers on the source and drain regions; and
   forming a deep trench isolation region surrounding the silicide layers and the gate electrode,
   wherein the deep trench isolation region is formed after the silicide layers are formed on the source and drain regions, and
   wherein the deep trench isolation region is deeper than the first to third insulating isolation regions, and is disposed to be in direct contact with an upper surface of the buried oxide layer.

8. The method of claim 7, wherein each of the P-type deep well region and the N-type deep well region is in direct contact with an upper surface of the N-type buried layer.

9. The method of claim 7, wherein the gate electrode comprises:
   first to fourth corners, each corner having a first radius of curvature;
   a first straight section between the first corner and the second corner;
   a second straight section between the third corner and the fourth corner, the first and second straight sections being parallel to each other; and
   a vertical axis passing through the first and second straight sections simultaneously and not overlapping the opening area, and
   wherein a channel length of the semiconductor device is extendable to a desired length about the vertical axis.

10. The method of claim 7, wherein the second insulating isolation region has a shape of a Roman character II in a top view, such that the second insulating isolation region has a closed-loop to isolate a bulk tap region from the source region, and the bulk tap region is disposed inside the closed-loop.

11. The method of claim 7, wherein the N-type deep well region comprises a first N-type deep well region and a second N-type deep well region spaced apart from each other, wherein the deep trench isolation region comprises a first deep trench isolation region and a second deep trench isolation region spaced apart from each other, and wherein the first N-type deep well region abuts the first deep trench isolation region, and the second N-type deep well region abuts the second deep trench isolation region.

12. The method of claim 1, further comprising:

forming an N-type drift region in contact with the P-type well region to form a PN junction region with the P-type well region, wherein the N-type drift region and the N-type well region are in contact with the N-type deep well region.

13. The method of claim 12, wherein the N-type drift region is spaced apart from the P-type deep well region.

14. The method of claim 7, further comprising:

forming an N-type drift region in contact with the P-type well region to form a PN junction region with the P-type well region, wherein the N-type drift region and the N-type well region are in contact with the N-type deep well region.

15. The method of claim 14, wherein the N-type drift region is spaced apart from the P-type deep well region.

16. A method of manufacturing a semiconductor device, the method comprising:

forming an N-type buried layer in a substrate;

forming a P-type deep well region and an N-type deep well region on the N-type buried layer, wherein the P-type deep well region is surrounded by a P-type epitaxial layer;

forming a P-type well region on the P-type deep well region, wherein the P-type well region has a width greater than that of the P-type deep well region in a horizontal direction;

forming an N-type drift region and an N-type well region on the N-type deep well region, respectively, wherein the N-type drift region is in contact with the P-type well region to form a PN junction and is spaced apart from the P-type deep well region;

forming a gate electrode having a closed-loop in which an opening area is formed in a central region, the gate electrode overlapping the P-type well region and the N-type drift region;

forming a source region and a drain region in the P-type well region and the N-type well region, respectively;

forming silicide layers on the source and drain regions; and forming a deep trench isolation region after the silicide layers are formed on the source and drain regions, wherein the deep trench isolation region is disposed to abut the N-type deep well region and the N-type buried layer and to enclose the gate electrode.

17. The method of claim 16, further comprising forming a buried oxide layer disposed under the N-type buried layer, wherein the deep trench isolation region is in direct contact with an upper surface of the buried oxide layer.

18. The method of claim 16, wherein the N-type drift region and the N-type well region are in direct contact with the N-type deep well region.

* * * * *